(12) United States Patent
Sohn et al.

(10) Patent No.: US 8,703,405 B2
(45) Date of Patent: Apr. 22, 2014

(54) METHODS OF GENERATING THREE-DIMENSIONAL PROCESS WINDOW QUALIFICATION

(75) Inventors: Young-Hoon Sohn, Seongnam-si (KR); Sang-Kil Lee, Yongin-si (KR); Yu-Sin Yang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/462,250

(22) Filed: May 2, 2012

(65) Prior Publication Data

US 2012/0315583 A1    Dec. 13, 2012

(30) Foreign Application Priority Data

Jun. 13, 2011    (KR) .......................... 10-2011-0056838

(51) Int. Cl.
 *G03F 7/00* (2006.01)
(52) U.S. Cl.
 USPC ................................. 430/322; 430/22; 430/30
(58) Field of Classification Search
 USPC ............................................... 430/322, 22, 30
 See application file for complete search history.

(56) References Cited

U.S. PATENT DOCUMENTS

| | | | |
|---|---|---|---|
| 7,273,685 B2 | 9/2007 | Sasazawa et al. | |
| 8,154,710 B2 | 4/2012 | Mimotogi et al. | |
| 2005/0214958 A1 | 9/2005 | Nakasuji et al. | |
| 2006/0078828 A1* | 4/2006 | Atkinson et al. | 430/313 |
| 2006/0183040 A1 | 8/2006 | Sasazawa et al. | |
| 2009/0244512 A1 | 10/2009 | Mimotogi et al. | |

FOREIGN PATENT DOCUMENTS

| | | |
|---|---|---|
| JP | 2005236061 | 9/2005 |
| JP | 2006228843 | 8/2006 |
| JP | 2009231767 | 10/2009 |

* cited by examiner

*Primary Examiner* — Cynthia Kelly
*Assistant Examiner* — Caleen Sullivan
(74) *Attorney, Agent, or Firm* — Onello & Mello, LLP

(57) ABSTRACT

In a method of generating a three-dimensional process window qualification, a photoresist layer is coated on a substrate including an underlying structure. A plurality of circular-shaped regions of the substrate are distinguished into 1 to n regions to partition the substrate into a center portion and an edge portion, n being a natural number greater than 2. 1 to n exposing ranges are set, including a common exposing condition for the 1 to n regions. A photoresist pattern is fox led by exposing each shot portion in the 1 to n regions using a split exposing condition in the 1 to n exposing ranges. The photoresist pattern is detected, and a normal photoresist pattern with respect to each of the 1 to n regions is selected to generate the three-dimensional process window qualification.

20 Claims, 10 Drawing Sheets

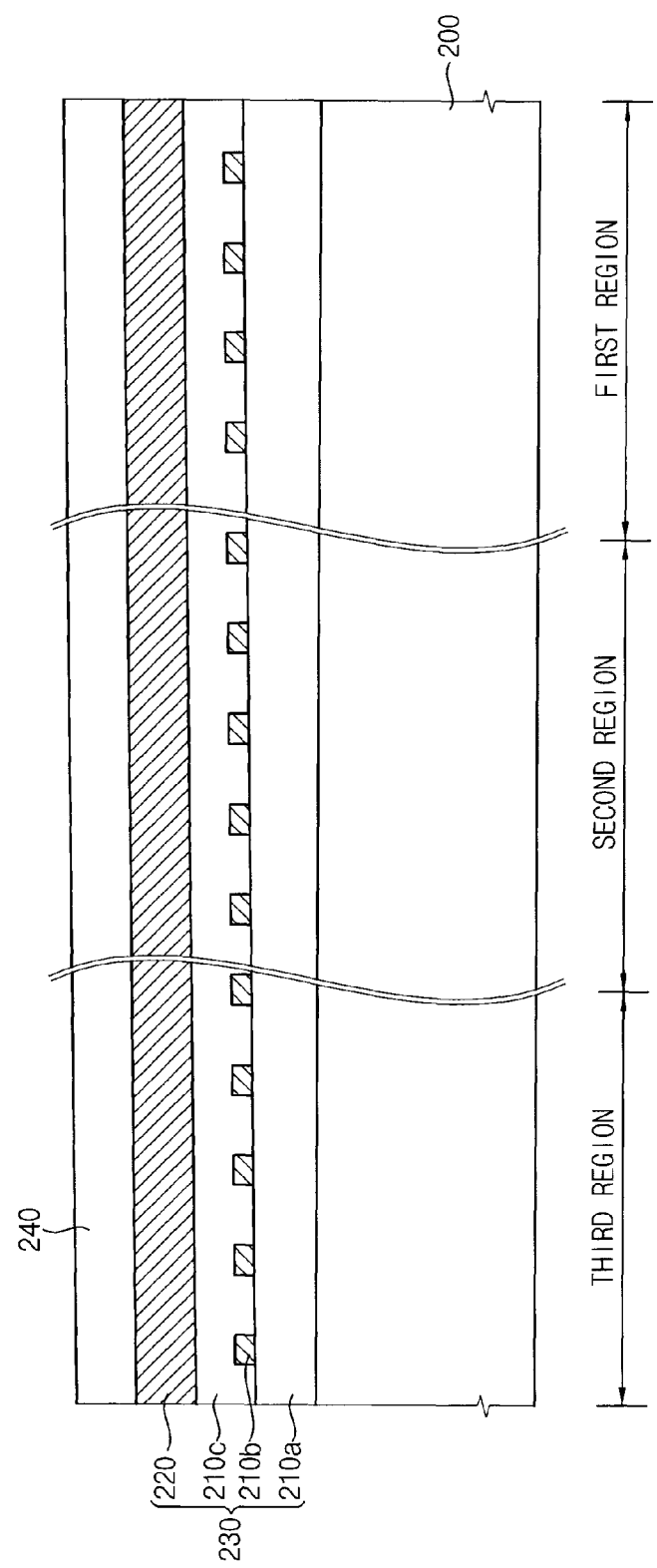

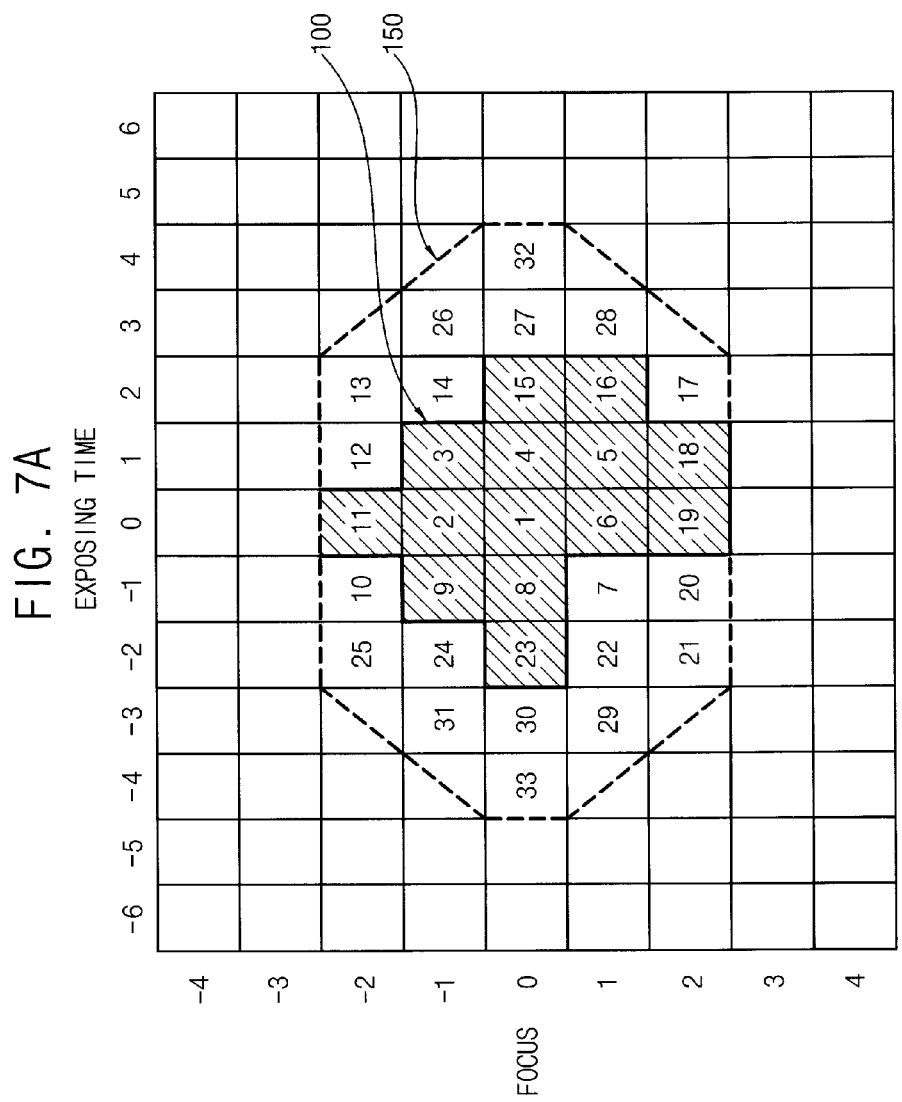

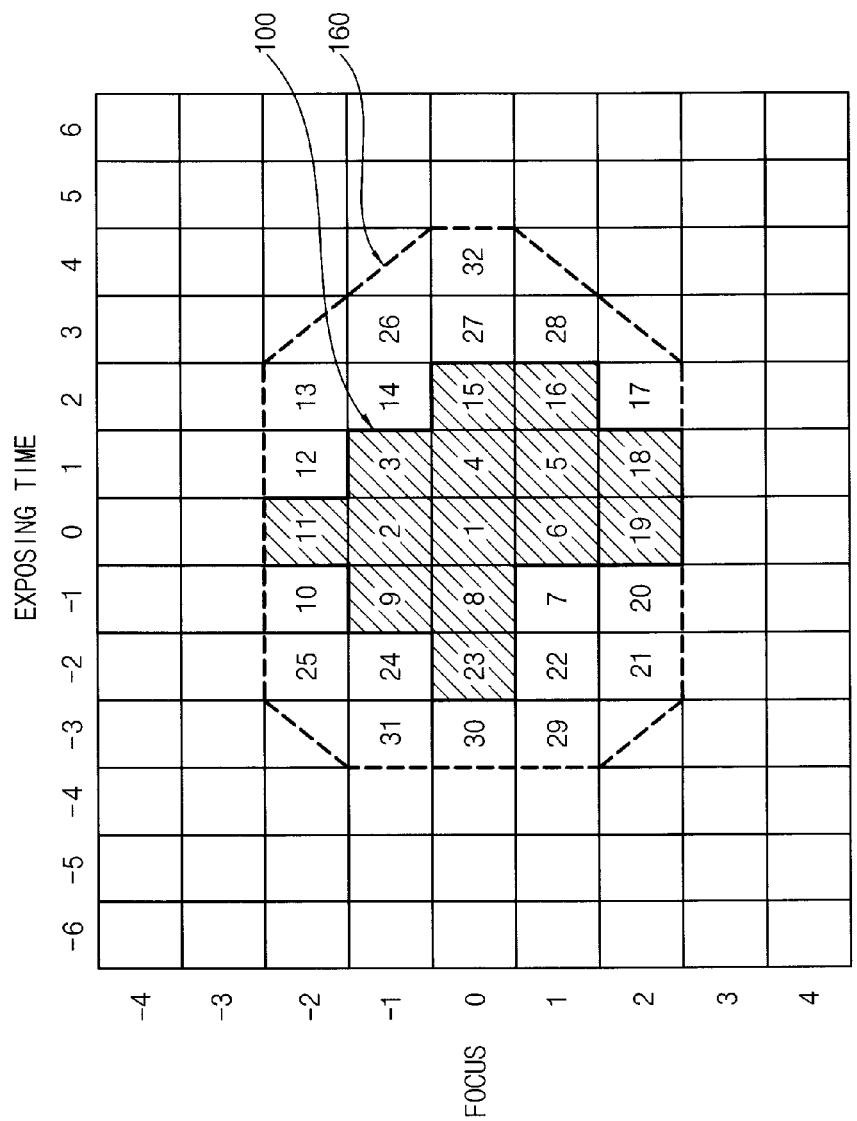

METHODS OF GENERATING THREE-DIMENSIONAL PROCESS WINDOW QUALIFICATION

CROSS-REFERENCE TO RELATED APPLICATIONS AND CLAIM OF PRIORITY

This application claims priority under 35 U.S.C. §119 to Korean Patent Application No. 10-2011-0056838, filed on Jun. 13, 2011 in the Korean Intellectual Property Office, the content of which is incorporated herein by reference in its entirety.

BACKGROUND

The inventive concepts relate to methods of generating a three-dimensional process window qualification. More particularly, the inventive concepts relate to methods of generating a three-dimensional process window qualification utilizing a process that considers the effects of underlying structures in accordance with their positions in or on a substrate.

With ever-increasing integration of semiconductor devices, as the cell size continues to decrease, the formation of defect-free, or normal, patterns becomes increasingly difficult. Along with that, the detection of defects that are present as a result of formation becomes more and more challenging. In the formation of normal patterns, accurate evaluation of a pattern process window qualification (PWQ), that is, a process condition margin for forming the normal patterns using a photolithography process, is needed. Generally, the PWQ may be evaluated by forming photoresist patterns by isolating two-dimensional photolithography conditions including parameters such as exposing focus and exposing time, and then detecting defects generated in each of the photoresist patterns. With increased integration of semiconductor devices, this approach is becoming increasingly limited in its ability to accurately perform PWQ.

SUMMARY

Some embodiments of the present inventive concepts provide methods of generating a three-dimensional process window qualification that considers the geometry of underlying structures in accordance with a region in a substrate. In this manner, the resulting PWQ can include considerations of additional features of the device, for example, certain states of underlying structures of the device, including the thicknesses of thin layers included in the underlying structure, the shape of the underlying structure, etc., which may vary in accordance with a position of the underlying structure in the substrate.

In an aspect, a method of generating a three-dimensional process window qualification comprises: coating a photoresist layer on a substrate including an underlying structure; distinguishing a plurality of circular-shaped regions of the substrate into 1 to n regions to partition the substrate into a center portion and an edge portion, n being a natural number greater than 2; setting 1 to n exposing ranges including a common exposing condition for the 1 to n regions; forming a photoresist pattern by exposing each shot portion in the 1 to n regions using a split exposing condition in the 1 to n exposing ranges; detecting the photoresist pattern; and selecting a normal photoresist pattern with respect to each of the 1 to n regions to generate the three-dimensional process window qualification.

In some embodiments, the 1 to n exposing range is an exposing condition range obtained by combining an exposing focus parameter and an exposing time parameter.

In some embodiments, the three-dimensional process window qualification is an exposing condition for forming the normal photoresist pattern using parameters including a region of the substrate, the exposing focus parameter and the exposing time parameter.

In some embodiments, at least some of the 1 to n exposing ranges are different from each other.

In some embodiments, the method further comprises a step of obtaining a two-dimensional process window qualification with respect to a second substrate including the underlying structure.

In some embodiments, the 1 to n exposing range includes the exposing range of the two-dimensional process window qualification and includes a wider range than the exposing range of the two-dimensional process window qualification.

In some embodiments, the obtaining of the two-dimensional process window qualification comprises: coating a photoresist layer on the second substrate including the underlying structure; forming a photoresist pattern by splitting the exposing condition and exposing each of the shot portions using the split exposing condition; detecting the photoresist pattern; and selecting a normal photoresist pattern and generating the two-dimensional process window qualification.

In some embodiments, each of the 1 to n regions is symmetric in upper and lower directions or left and right directions with respect to a central region of the substrate.

In some embodiments, the exposing is performed by varying one of the exposing focus or the exposing time incrementally while moving the shot from one optionally set shot to a next shot in a circular direction or a spiral direction, the exposing condition applied for each of the shot portions being a split condition.

In some embodiments, the 1 to n regions are partitioned in relation to a corresponding degree of at least one of flatness or thickness of the underlying structure.

In some embodiments, the method further comprises a step of analyzing pattern defects generated in each region by using a relation of the at least one of flatness or thickness of the underlying structure for each of the 1 to n regions with the process window qualification for each of the 1 to n regions.

In some embodiments, the common exposing condition in the 1 to n exposing range is the two-dimensional process window qualification obtained from a separate substrate.

In some embodiments, n represents 2 to 5 in the 1 to n exposing regions.

In another aspect a method of generating a process window qualification comprises: partitioning a substrate into at least one ring-shaped outer regions about a central region, the outer regions and the central region each in turn being identified by a plurality of shot portions; setting a common exposing range for each of the at least one outer regions and the central region; forming a photoresist pattern in multiple shot portions of the at least one outer regions and the central region using a different exposing condition for each shot portion; determining a normal condition of the photoresist pattern formed in the multiple shot portions; and generating a multiple-dimensional process window qualification in response to a range of exposing conditions leading to a formation of normal photoresist patterns for the at least one outer regions and the central region of the substrate.

In some embodiments, the shot portions are rectangular-shaped portions of the at least one outer regions and central region.

In some embodiments, the exposing condition includes an exposing focus parameter.

In some embodiments, the exposing condition includes an exposing time parameter.

In some embodiments, the exposing condition is varied among the shot portions as the step of forming a photoresist pattern proceeds among the shot portions.

In some embodiments, partitioning the substrate occurs in accordance with a property of an underlying structure.

In some embodiments, the property is a relative flatness of the underlying structure.

As described herein the three-dimensional PWQ generated in accordance with exemplary embodiments may be evaluated by considering an exposing position in a substrate region in addition to an exposing focus and an exposing time as a split condition. The three-dimensional PWQ in accordance with exemplary embodiments can further and optionally be obtained by considering the flatness of underlying structures in accordance with the substrate region. Utilizing a thus-obtained three-dimensional PWQ, defect-generating tendency and defect-generating conditions in accordance with differences in flatness of underlying structures can be accurately evaluated. As a result, defect-free patterns may be more readily obtained and manufacturing yield can thereby be increased.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

FIG. 6 is a cross-sectional view of a substrate including a photoresist layer and an underlying structure, in accordance with exemplary embodiments.

FIG. 7A illustrates an exposing range in a first region of a substrate, in accordance with exemplary embodiments.

FIG. 7B illustrates an exposing range in a second region and a third region of a substrate, in accordance with exemplary embodiments.

DETAILED DESCRIPTION OF EMBODIMENTS

Figure 1:
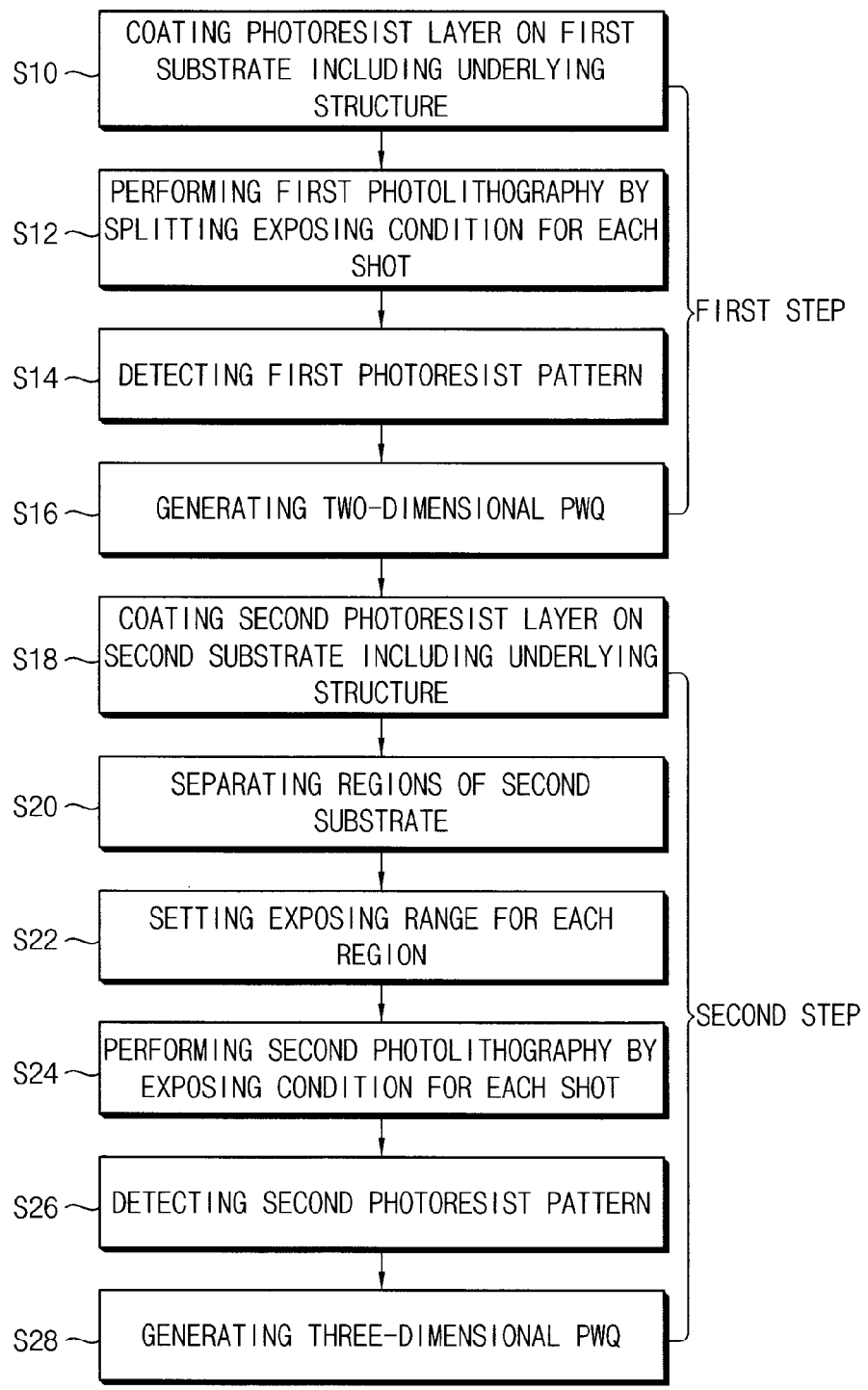
FIG. 1 is a flow chart for explaining a method of generating a three-dimensional PWQ in accordance with exemplary embodiments.

Various exemplary embodiments will be described more fully hereinafter with reference to the accompanying drawings, in which some exemplary embodiments are shown. The present inventive concepts may, however, be embodied in many different forms and should not be construed as limited to the exemplary embodiments set forth herein. Rather, these exemplary embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Hereinafter, exemplary embodiments of methods of generating a three-dimensional PWQ in accordance with exemplary embodiments will be explained in detail. In the methods of generating the three-dimensional PWQ in accordance with exemplary embodiments, a first step of generating a two-dimensional PWQ and a second step of setting a condition range using the two-dimensional PWQ and then, generating the three-dimensional PWQ, may be performed.

FIG. 1 is a flow chart for explaining a method of generating a three-dimensional PWQ in accordance with exemplary embodiments.

First, a first step FIRST STEP of generating a two-dimensional PWQ may be performed.

Referring to FIG. 1, a first substrate including underlying structures may be provided. The underlying structure may include, in some embodiments, an underlying layer pattern, an underlying layer or an object layer to be etched. On the underlying structure or object layer to be etched, a photoresist layer may be coated (Step S10). In some embodiments, the photoresist layer may comprise a mask layer for patterning the underlying structure or object layer to be etched.

The photoresist layer may be exposed and then developed to form the photoresist pattern and the underlying structure or object layer to be etched may be patterned using the photoresist pattern as an etching mask in practical process of manufacturing a semiconductor device. The exposing process for patterning the photoresist layer may be required to be performed by an optimized exposing condition. Even though the optimized process conditions may be set for exposing equipment, the photoresist pattern may be sometimes formed abnormally because of a permissible error of the exposing process equipment, a state change of the underlying structure, or due to other abnormalities. Accordingly, an evaluation of an accurate PWQ depending on an allowable range of an exposing focus and an allowable range of an exposing time may be required to form the photoresist pattern normally through the photolithography process. Depending on the PWQ margin, equipment maintenance and repairing condition and management of exposing conditions may be controlled.

In order to evaluate the two-dimensional PWQ, shot portions to be exposed by a first exposing process may be identified in the photoresist layer. A first photolithography process may be performed by splitting exposing conditions so that each shot portion in the photoresist layer may be exposed by changing the exposing condition of at least one of exposing focus and exposing time (Step S12). Through the first photolithography process, photoresist patterns for evaluating the two-dimensional PWQ may be obtained.

Figure 2:
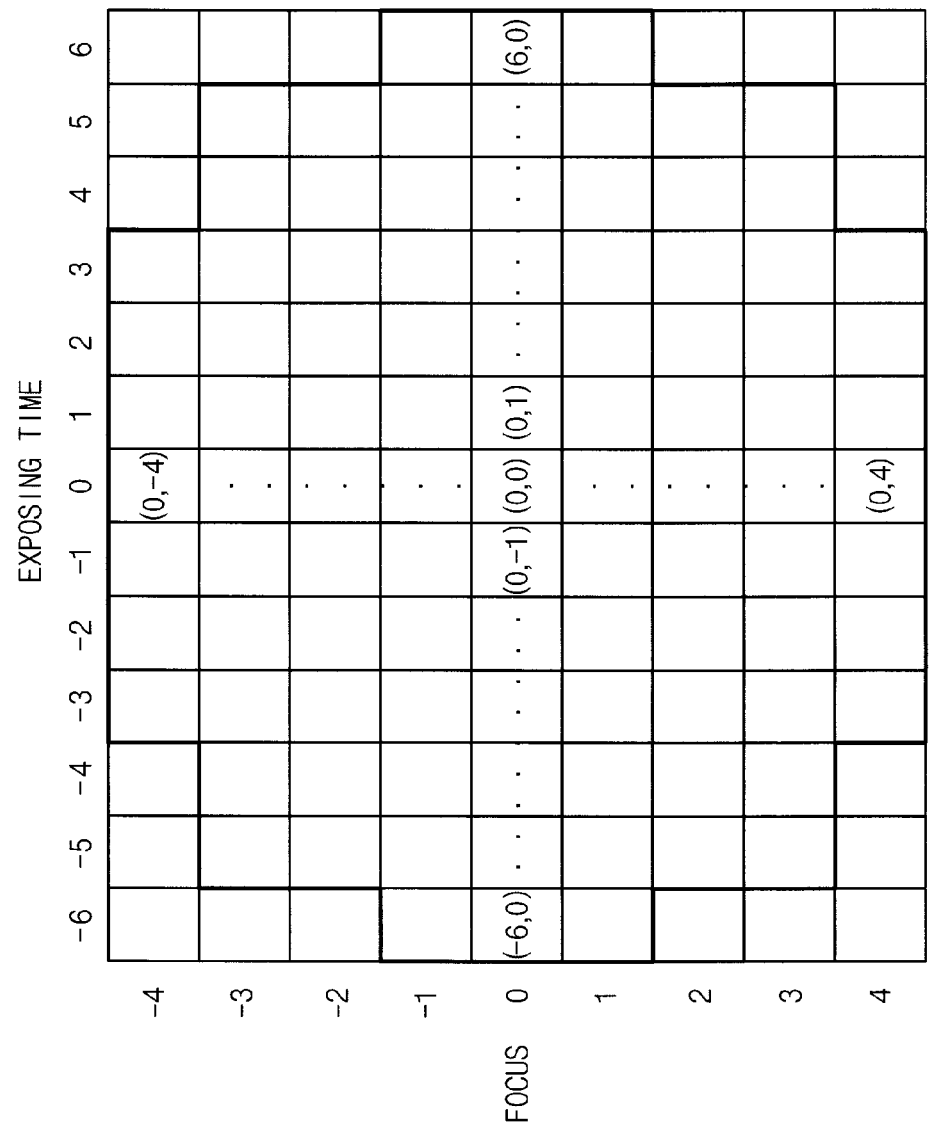
FIG. 2 is an exemplary coordinate illustrating split exposing conditions for each of shot portions in a substrate.

FIG. 2 is an exemplary coordinate illustrating split exposing conditions for each of shot portions in a substrate.

Referring to FIG. 2, when an optimized focus condition in the photolithography process for patterning the object layer to be etched is set to zero, the focus condition may be split in a range of from −4 to 4 in accordance with deviated degree from the optimized focus condition and direction from a center point of the zero. This range is expressed in the ordinate of the coordinate system of FIG. 2. In addition, when an optimized exposing time condition is set to zero, the exposing time condition may be split in a range of from −6 to 6 in accordance with deviated degree from the optimized exposing time condition and direction from a center point of the zero. This range is expressed in the abscissa of the coordinate system of FIG. 2. The number ranges may be obtained by expressing the optimized conditions of the focus and/or the exposing time conditions numerically. Increase of an absolute value of the number may represent increase of the deviated degree from the optimized conditions.

Each of the shot portions of the photoresist layer may be illustrated in a coordinate system. An x-axis of the coordinate may represent the exposing time and a y-axis of the coordinate may represent the focus. In this case, the exposing process may be performed for each of the shot portions using an exposing condition corresponding to the coordinate. Accordingly, the shot portion positioned at the center portion of the substrate may correspond to the coordinate (0, 0) and may correspond to an exposure using the optimized exposing condition. Any of the shot portions provided at a position that is deviated from the center portion may be exposed by an exposing condition deviated from the optimized condition. The further the distance of the shot portion from the center portion to the edge portion of the substrate, the greater the deviation from the optimized exposing condition.

After completing the exposing process, the photoresist layer may be developed to form the photoresist pattern.

Returning to FIG. 1, the photoresist pattern formed in each of the shot portions through the first photolithography process may be examined to detect the occurrence of defects (Step S14).

Based on the result of examining the photoresist pattern for the occurrence of defects, a two-dimensional PWQ may be obtained using the applied process conditions for the shot portions excluding the process conditions for those shots in which pattern defects occurred (Step S16).

Figure 3:
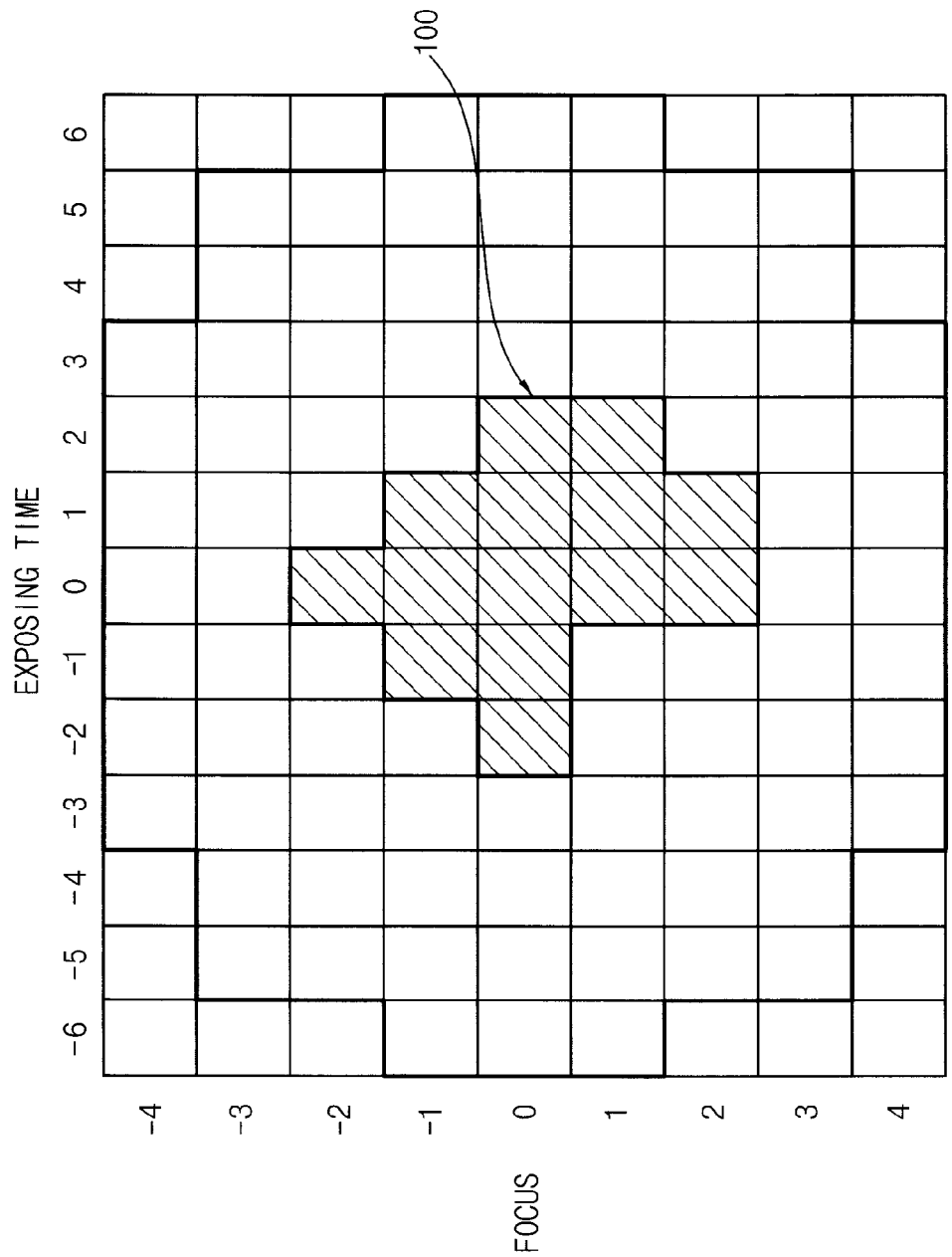
FIG. 3 illustrates an example of a two-dimensional PWQ.

FIG. 3 illustrates an example of a two-dimensional PWQ.

Referring to FIG. 3, an exposing condition in a portion designated by reference numeral 100 illustrates the two-dimensional PWQ. The two-dimensional PWQ 100 represents an allowable range of exposing conditions that are known to result in the formation of normal patterns. From the two-dimensional PWQ 100, the deviated state of the exposing condition for forming the normal pattern based on the optimized exposing condition may be evaluated.

A step process for forming the two-dimensional PWQ may be completed, for example using the above-described method.

However, the two-dimensional PWQ 100 obtained through performing the processes described above may not consider certain other factors, including, for example, the flatness of an underlying structure, the distribution of the underlying structure, differences in shape of the underlying structure, and the like. That is, the two-dimensional PWQ 100 of the type shown in FIG. 3 may be obtained under the assumption that the underlying structure is uniform over the entire substrate, an assumption which is generally not reflective of actual conditions Accordingly, the two-dimensional PWQ 100 may be regarded as having potential inaccurate values as they relate to the underlying structures, since the underlying structures themselves can contribute to the occurrence of pattern defects.

In addition, when the photolithography process is performed by graphically distributing the exposing conditions along the abscissa and ordinate, as illustrated in FIG. 2, the optimized exposing condition can be considered to correspond with the center portion of the substrate. Accordingly, the outer portions, including outer edge portions, of the substrate may be exposed in response to largely deviated exposing conditions relative to the optimized exposing conditions. Therefore, the margin of the two-dimensional PWQ 100 may be obtained based on the exposing conditions at the shot portions proximal to the center portion.

Since the two-dimensional PWQ 100 is obtained by detecting the center portion of the substrate, the two-dimensional PWQ 100 obtained through the above-described method may relatively accurately correspond to the exposing condition at the center portion of the substrate. However, since the flatness and the shape of the underlying structures at the edge portions of the substrate may be different from those at the center portion of the substrate, the thus-obtained two-dimensional PWQ 100 may not accurately correspond to the exposing condition at the edge portions of the substrate.

Referring back to FIG. 1, Hereinafter, a second step process SECOND STEP for generating the three-dimensional PWQ may be explained.

In order to generate the three-dimensional PWQ, a second substrate including the same underlying structure as that included on the first substrate may be prepared or otherwise provided. In various examples, the underlying structure may include an object layer to be etched, an underlying layer and an underlying layer pattern. A photoresist layer may be coated on the object layer to be etched (Step S18). The photoresist layer may be formed by applying the same process conditions as those used to form the photoresist layer formed on the first substrate. In addition, shot portions may be separated, or independently identified, with respect to the photoresist layer.

The shot portions in the second substrate may be partitioned, divided, separated or otherwise categorized according to various-shaped regions, such as circular-shaped, or ring-shaped, regions, relative to the center position of the substrate, and the separated regions may be designated according to regions, such as first, second and third regions (Step S20).

Figure 4:
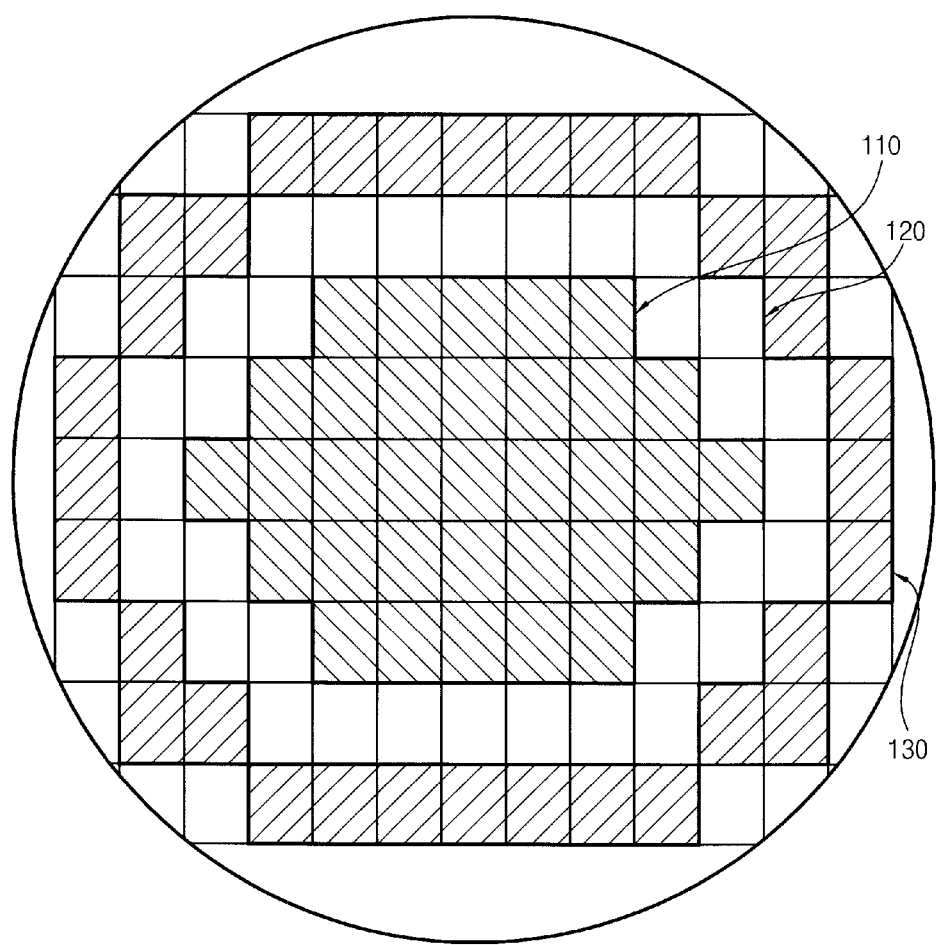
FIG. 4 is a plan view illustrating a second substrate including separately identified, or partitioned, regions, in accordance with exemplary embodiments.

FIG. 4 is a plan view illustrating a second substrate including separated regions.

Referring to FIG. 4, a first region 110 may correspond to a center portion of the substrate. In addition, a second region 120 and the third region 130 having circular or ring shapes that are centered about a first region 110, may be provided. Each of the shot portions may be provided in one of the first, second and third regions 110, 120 and 130.

Since it is common for substrates to be used in the manufacturing of semiconductor device to have a disc shape, variation in the flatness of most of thin layers on the substrate may correspond to circular ring shapes that are distributed from the center portion to the edge portion of the substrate. Particularly, the flatness of the thin layers of an amorphous carbon layer (ACL), a spin-on hard mask layer (SOH), a layer obtained by depositing silicon oxynitride (SiON), etc. may vary from the center portion to the edge portion.

Figure 5:
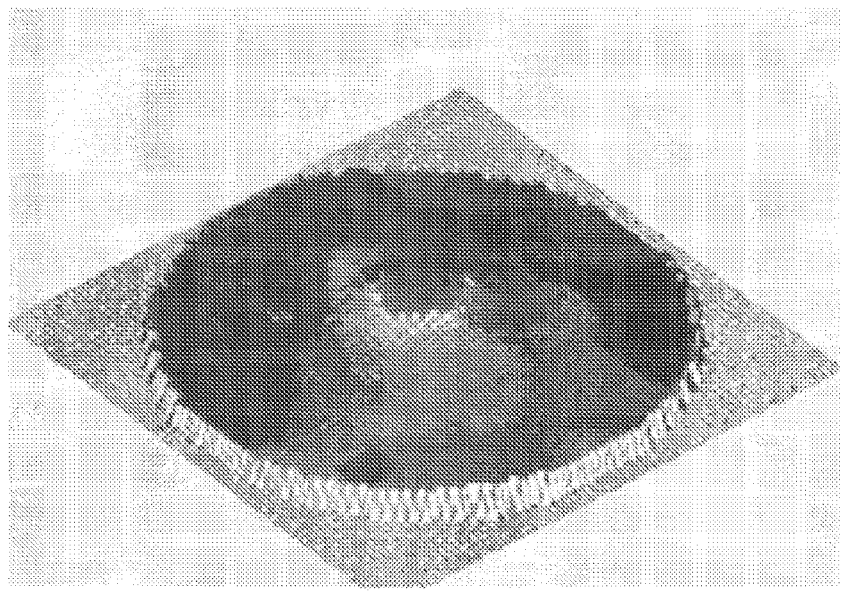
FIG. 5 is a perspective view of a spin-on hard mask layer formed on a substrate.

FIG. 5 is a perspective view of a spin-on hard mask layer formed on a substrate.

Referring to FIG. 5, the spin-on hard mask layer at the center portion of the substrate may have an upper surface portion that is thicker in the center portion than that at the edge portion of the substrate.

FIG. 6 is a cross-sectional view of a substrate including a photoresist layer and an underlying structure.

Referring to FIG. 6, the thickness of an underlying structure 230 formed in first to third regions 110, 120 and 130 (see, for example, FIG. 4) of a substrate 200 may be different. As a result, the flatness of a photoresist layer 240 may be different over the first to third regions 110, 120 and 130. In the present illustration of FIG. 6, the underlying structure 230 in the first region has a thickness that is greater than that of the second region, and the underlying structure 230 in the second region has a thickness that is greater than that of the third region. The underlying structure 230 may include an underlying layer pattern 210b, underlying layers 210a and 210c and an object layer to be etched 220.

The thickness of the underlying structure 230 at the center portion corresponding to the first region may be greater than that at the edge portion corresponding to the third region in FIG. 6. However, in alternative embodiments, the thickness of the underlying structure 230 at the center portion corresponding to the first region may be smaller than that at the edge portion corresponding to the third region in accordance with the types of layers included in the underlying structure 230.

As described above, the properties of flatness or thickness of the underlying structure 230 formed in the substrate 200 may be different in the various regions including differences between the center portion and the edge portion.

Accordingly, it may be desired to separately identify the center portion and the edge portion of the second substrate so that the flatness or thickness of the underlying structure in each region may be compensated for in the second substrate. In exemplary embodiments, three circular-shaped regions may be identified, including a circular central portion, an inner ring portion and an outer ring, or edge, portion, the second substrate. Alternatively, the second substrate may be identified by two regions, four regions or more than four regions.

The number of shot portions, or independently identifiable sub-regions, included in the first region 110, the second region 120 and the third region 130 may be the same or different. In exemplary embodiments, the first region 110 can include 33 shots, the second region 120 can include 32 shots and the third region 130 can include 32 shots, as illustrated in FIG. 4.

It may be desired to have a symmetric structure in an upper and lower direction and a symmetric structure in a left and right direction with respect to a central axis of an x-direction and a y-direction of the substrate in the shots categorized according to the first, second and third regions 110, 120 and 130. An accurate PWQ for each region may be obtainable when each of the first to third regions 110, 120 and 130 is not inclined in the upper and lower side direction and in the left and right side direction of the substrate.

Returning to FIG. 1, an exposing range of an exposing condition applied for each exposing process may be set for the first to third regions 110, 120 and 130 (Step S22). The exposing range may comprise an exposing condition range obtained by combining a focus parameter and an exposing time parameter. The exposing range applied for the exposing process in each of the regions may include a common exposing condition. The common exposing condition may comprise conditions that correspond to the two-dimensional PWQ.

FIG. 7A illustrates an exposing range as applied to a first region of a substrate. FIG. 7B illustrates an exposing range as applied to a second region and a third region of a substrate.

Referring to FIGS. 7A and 7B, exposing conditions within a region or circle designated by reference numerals 150 and 160 may become the exposing range. In addition, numbers may be designated for the exposing condition of each coordinate. In the present example, reference numeral 1 represents a coordinate of an exposing time and a focus of (0, 0) and corresponds to an optimized exposing condition. Reference numeral 32 represents an exposing time and a focus of (4, 0) and corresponds to a condition having a focus that is the same as the optimized focus condition and having an exposing time that is deviated by 4 relative to the optimized exposing time condition.

A first exposing range of the conditions for the second exposing process may be set to obtain the three-dimensional PWQ in the first region 110. The first exposing range may include at least the two-dimensional PWQ 100 illustrated in FIG. 3 and may be set as an exposing condition range that is wider than the two-dimensional PWQ 100. In addition, the first exposing range may be set to a narrower range than the exposing range applied for the first exposing process. The first exposing range may be set to selected exposing conditions among the exposing conditions applied for the first exposing process.

Particularly, for the first exposing range 150, the focus condition may be split into from −2 to 2 in accordance with a deviated degree from the optimized focus condition and considering a direction when the optimized focus condition is set to zero. In addition, the exposing time condition may be split into from −4 to 4 in accordance with a deviated degree from the optimized exposing time condition and considering a direction when the optimized exposing time condition is set to zero. Accordingly, the first exposing range 150 may be set as a matrix of the focus and the exposing time having the same number of the shot portions included in the first region. The first exposing range 150 may be set to each of the exposing conditions designated by the numbers 1 to 33.

Then, a second exposing range of the second exposing process conditions may be set to obtain the three-dimensional PWQ in the second region. The second exposing range may include at least the two-dimensional PWQ 100 and may be set to a wider range of the exposing conditions than that of the two-dimensional PWQ 100. In addition, the second exposing range may be set to a narrower range than the exposing range applied for the first exposing process. Particularly, selected exposing conditions may be set among the exposing conditions applied for the first exposing process. The second exposing range may be the same as the first exposing range 150. Alternatively, a portion of the second exposing range may be different from the first exposing range 150. In exemplary embodiments, the second exposing range 160 may be set as illustrated in FIG. 7B. The second exposing range 160 may be set to each of the exposing conditions designated by numbers 1 to 32.

Further, a third exposing range of the exposing conditions applied for the second exposing process may be set to obtain the three-dimensional PWQ in the third region. The third exposing range may include at least the two-dimensional PWQ 100 and may be set to a wider range of the exposing conditions than that of the two-dimensional PWQ 100. The third exposing range may be set to a narrower range than the exposing range applied for the first exposing process. Particularly, selected exposing conditions may be set among the exposing conditions applied for the first exposing process. The third exposing range may be the same as the first and second exposing ranges. Alternatively, a portion of the third exposing range may be different from the first and second exposing ranges. In exemplary embodiments, the third exposing range 160 may be set as illustrated in FIG. 7B. The third exposing range 160 may be set to each of the exposing conditions designated by numbers 1 to 32.

A second photolithography process may be performed with respect to the photoresist layer using the exposing range conditions for the first, second, and third regions (Step S24). The second photolithography process may be performed to obtain the PWQ of the photolithography process for patterning the object layer to be etched for each region of the substrate. The order of performing the exposing process in the second photolithography process may not be limited. That is, the order of performing the exposing process in the second photolithography process may be from the first region 110 to the third region 130 or may be from the third region 130 to the first region 110. Alternatively, the order of performing the exposing process may be set by moving each of the shot portions one by one irrespective of the separated regions.

Figure 8:
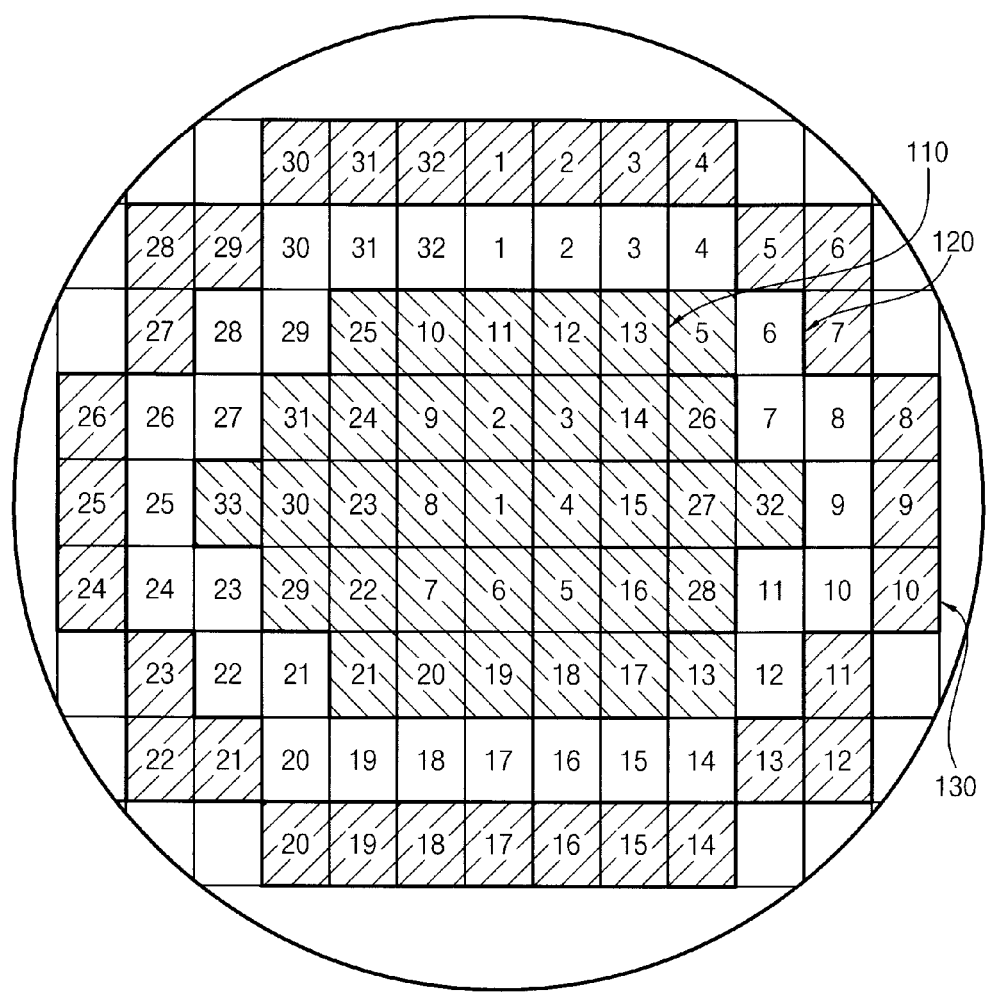
FIG. 8 illustrates exposing conditions on each of shot portions in a second substrate to evaluate a three-dimensional PWQ, in accordance with exemplary embodiments.

FIG. 8 illustrates exposing conditions on each of shot portions in a second substrate to evaluate a three-dimensional PWQ.

A photolithography process may be performed using each exposing condition within the first exposing condition 150 for each shot portion positioned in the first region 110. Particularly, the photolithography process may be performed by each exposing condition designated by numbers 1 to 33 for each shot portion in the first region 110 as illustrated in FIG. 8. Accordingly, the photolithography process may be performed for each shot portion in accordance with different exposing conditions for each shot.

When setting the exposing condition for each shot portion, one of the focus and the exposing time may vary incrementally, one by one, while moving the shot portion from the center portion to a next shot portion adjacent to the center portion in a circular direction or in a spiral direction. By splitting the matrix of the focus and the exposing condition in the circular direction or the spiral direction incrementally, the exposing condition of a neighboring region may not be largely changed. Alternatively, one of the focus and the exposing time may vary one by one while moving the shot portion from the center portion to a next shot portion in a radial direction. The direction and order of performing the exposing process may not be limited to the above-described examples.

Next, the photolithography process can be performed in accordance with each of the exposing conditions in the second exposing range 160 for each shot portion positioned in the second region 120. Particularly, the photolithography process may be performed by each exposing condition designated by the numbers 1 to 32 with respect to each shot portion in the second region 120. Accordingly, the photolithography process may be performed in accordance with different exposing conditions for each shot portion.

When setting the exposing condition for each shot portion in the second region 120, one of the focus and the exposing time may vary, incrementally, or one by one, while moving the shot portion from an optionally selected shot portion to a next shot portion adjacent to the center portion in a circular direction or a spiral direction.

The photolithography process may be performed by each exposing condition in the third exposing range 160 for each of the shot portions positioned in the third region 130. Particularly, the photolithography process may be performed by each exposing condition designated by numbers 1 to 32 for each shot portion in the third region 130 as illustrated in FIG. 8. Accordingly, the photolithography process may be performed in accordance with different exposing conditions for each shot portion.

When setting the exposing condition for each shot portion in the third region 130, one of the focus and the exposing time may vary incrementally, or one by one, while moving the shot portion from an optionally selected shot portion to a next shot portion adjacent to the center portion in a circular direction or a spiral direction.

When the photoresist layer is exposed by the method described above, the exposing process may be performed in accordance with the exposing condition set for each of the first to third regions 110, 120 and 130. The shot portions undergoing the same exposing process may be provided in each of the regions.

After performing the exposing process with respect to the photoresist layer, a developing process may be performed to form photoresist patterns.

The photoresist pattern formed in each shot portion through the second photolithography process may be examined to detect pattern defects (Step S26).

After examining the pattern defects, each of the PWQ for the first to third regions 110, 120 and 130 may be obtained from the process conditions corresponding to the shot portions not generating the pattern defects. The three-dimensional PWQ may be generated using each of the PWQ (Step S28) of the first, second and third regions 110, 120, 130.

The flatness or thickness of the underlying structure and the thickness of a thin layer included in the underlying structure may be different for each of the first, second, and third regions 110, 120 and 130. Accordingly, the photoresist patterns may not have the same shapes in each of the first to third regions 110, 120 and 130 even for the shots undergoing the exposing process using the same exposing conditions. The PWQ obtained in each of the first to third regions 110, 120 and 130 may have different margins relative to each other. Particularly, the PWQ margin in the third region 130 may be narrower than that in the first region 110.

The three-dimensional PWQ margin may be obtained using the PWQ obtained in each of the regions. The three-dimensional PWQ may be the exposing condition for forming a normal photoresist pattern obtained by considering parameters of the region of the substrate, the focus and the exposing time. The three-dimensional PWQ margin may be obtained in a coordinate including x, y and z axes of parameters of the focus, the exposing time and the region of the substrate, respectively.

Figure 9:
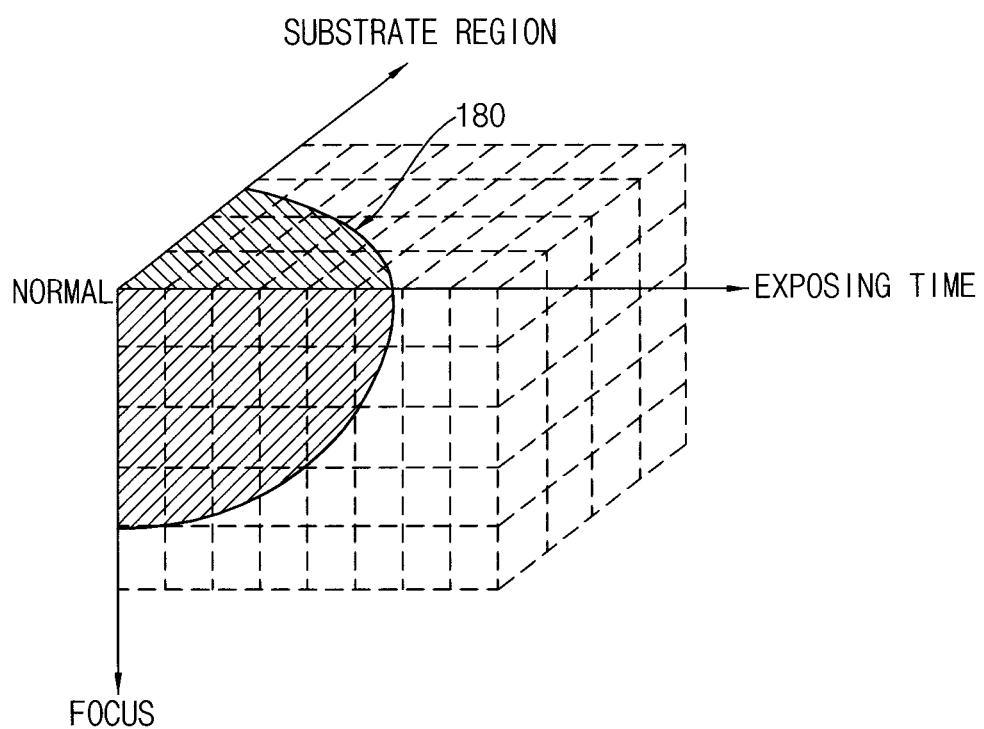
FIG. 9 is a coordinate system illustrating a three-dimensional PWQ margin, in accordance with exemplary embodiments.

FIG. 9 is a coordinate illustrating a three-dimensional PWQ margin.

Referring to FIG. 9, a three-dimensional PWQ margin 180 may have a globular, spherical, ellipsoidal, or other three-dimensional volumetric shape, and may correspond to regions of a substrate. The optimal exposing conditions of the first, second and third regions 110, 120 and 130 may be independently related to the flatness of the underlying structure in those regions. Accordingly, the resulting three-dimensional PWQ margin 180 may be dependent on the flatness of the underlying structure.

As described above, the number of the exposing conditions applied for the exposing condition for the three-dimensional PWQ 180 may be smaller than those of the two-dimensional PWQ 100. The three-dimensional PWQ 180 need not necessarily be obtained by applying diversely split exposing conditions. Accordingly, the two-dimensional PWQ margin 100 may be obtained in advance and then, the accurate three-dimensional PWQ may be obtained by setting the exposing conditions required for obtaining the three-dimensional PWQ 180 for each of the regions using the margin of the two-dimensional PWQ 100.

Each of the regions of the substrate may be identified in response to the shape and the flatness of the underlying structure. Some of the exposing conditions may be included in the exposing conditions in the margin of the two-dimensional PWQ 100, however, defects may be generated in the three-dimensional PWQ 180. In this case, the tendency of the defects generated by the exposing condition of the three-dimensional PWQ 180 may be compared to the shape and the flatness of the underlying structure for each of the regions of the substrate. The defects mainly generated by the exposing condition in the two-dimensional PWQ margin 100 may be analyzed.

In addition, since the PWQ in the third region 130 provided at an edge portion of the second substrate may be evaluated under similar exposing conditions to those of the first region 110, which is a center region, an accurate PWQ for the third region 130 may be obtained. Productivity at the edge portion of the substrate may therefore be increased using the three-dimensional PWQ 180.

Hereinafter, a method of evaluating a three-dimensional PWQ in accordance with another exemplary embodiment may be described.

Explanation of the first step processes for obtaining a two-dimensional PWQ may be omitted.

That is, the first step processes illustrated in the flow chart of FIG. 1 may be omitted, and only the second step processes in FIG. 1 may be performed to obtain the three-dimensional PWQ.

Since the two-dimensional PWQ may not be evaluated in accordance with another exemplary embodiment, first to third exposing ranges applied for the first to third regions may not be set using the two-dimensional PWQ. Accordingly, the first to third exposing ranges may include optimized conditions of a focus and an exposing time and may be set to a deviate value from the optimized condition by a certain degree in each direction. The deviated degree from the optimized condition may be optionally set.

The three-dimensional PWQ may be obtained without performing the processes for obtaining the two-dimensional PWQ and may be simply obtained in accordance with the present, above-described method.

As described above, a three-dimensional PWQ may be obtained by considering a shape and a flatness of an underlying structure in a substrate in accordance with exemplary embodiments. Using the three-dimensional PWQ, a photolithography process condition of a semiconductor device including minute patterns may be accurately set. The three-dimensional PWQ may be also used for maintaining and repairing of an equipment of a photolithography process.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. A method of generating a three-dimensional process window qualification comprising:
    coating a photoresist layer on a substrate including an underlying structure;
    distinguishing a plurality of circular-shaped regions of the substrate into 1 to n regions to partition the substrate into a center portion and an edge portion, n being a natural number greater than 2;
    setting 1 to n exposing ranges including a common exposing condition for the 1 to n regions;

forming a photoresist pattern by exposing each shot portion in the 1 to n regions using a split exposing condition in the 1 to n exposing ranges;

detecting the photoresist pattern; and selecting a normal photoresist pattern with respect to each of the 1 to n regions to generate the three-dimensional process window qualification.

2. The method of claim 1, wherein the 1 to n exposing range is an exposing condition range obtained by combining an exposing focus parameter and an exposing time parameter.

3. The method of claim 2, wherein the three-dimensional process window qualification is an exposing condition for forming the normal photoresist pattern using parameters including a region of the substrate, the exposing focus parameter and the exposing time parameter.

4. The method of claim 1, wherein at least some of the 1 to n exposing ranges are different from each other.

5. The method of claim 1, further comprising a step of obtaining a two-dimensional process window qualification with respect to a second substrate including the underlying structure.

6. The method of claim 5, wherein the 1 to n exposing range includes the exposing range of the two-dimensional process window qualification and includes a wider range than the exposing range of the two-dimensional process window qualification.

7. The method of claim 5, wherein the obtaining of the two-dimensional process window qualification comprises:

coating a photoresist layer on the second substrate including the underlying structure;

forming a photoresist pattern by splitting the exposing condition and exposing each of the shot portions using the split exposing condition;

detecting the photoresist pattern; and selecting a normal photoresist pattern and generating the two-dimensional process window qualification.

8. The method of claim 1, wherein each of the 1 to n regions is symmetric in upper and lower directions or left and right directions with respect to a central region of the substrate.

9. The method of claim 1, wherein the exposing is performed by varying one of the exposing focus or the exposing time incrementally while moving the shot from one optionally set shot to a next shot in a circular direction or a spiral direction, the exposing condition applied for each of the shot portions being a split condition.

10. The method of claim 1, wherein the 1 to n regions are partitioned in relation to a corresponding degree of at least one of flatness or thickness of the underlying structure.

11. The method of claim 10, further comprising a step of analyzing pattern defects generated in each region by using a relation of the at least one of flatness or thickness of the underlying structure for each of the 1 to n regions with the process window qualification for each of the 1 to n regions.

12. The method of claim 1, wherein the common exposing condition in the 1 to n exposing range is the two-dimensional process window qualification obtained from a separate substrate.

13. The method of claim 1, wherein n represents 2 to 5 in the 1 to n exposing regions.

14. A method of generating a process window qualification comprising:

partitioning a substrate into at least one ring-shaped outer region about a central region, the outer region and the central region each in turn being identified by a plurality of shot portions;

setting a common exposing range for each of the at least one outer region and the central region, wherein the exposing range is an exposing condition range obtained by combining an exposing focus parameter and an exposing time parameter;

forming a photoresist pattern in multiple shot portions of the at least one outer region and the central region using a different exposing condition for each shot portion;

determining a normal condition of the photoresist pattern formed in the multiple shot portions; and generating a multiple-dimensional process window qualification in response to a range of exposing conditions leading to a formation of normal photoresist patterns for the at least one outer region and the central region of the substrate.

15. The method of claim 14 wherein the shot portions are rectangular-shaped portions of the at least one outer region and central region.

16. The method of claim 14 wherein the exposing condition includes an exposing focus parameter.

17. The method of claim 14 wherein the exposing condition includes an exposing time parameter.

18. The method of claim 14 wherein the exposing condition is varied among the shot portions as the step of forming a photoresist pattern proceeds among the shot portions.

19. The method of claim 14 wherein partitioning the substrate occurs in accordance with a property of an underlying structure.

20. The method of claim 19 wherein the property is a relative flatness of the underlying structure.

* * * * *